US012660395B2

(12) United States Patent
Huang et al.

(10) Patent No.: US 12,660,395 B2
(45) Date of Patent: Jun. 16, 2026

(54) ELECTRONIC DEVICE

(71) Applicant: Innolux Corporation, Miaoli County (TW)

(72) Inventors: Chun-Hui Huang, Miao-Li County (TW); Tsau-Hua Hsieh, Miao-Li County (TW)

(73) Assignee: Innolux Corporation, Miaoli County (TW)

( * ) Notice: Subject to any disclaimer, the term of this patent is extended or adjusted under 35 U.S.C. 154(b) by 359 days.

(21) Appl. No.: 18/454,068

(22) Filed: Aug. 23, 2023

(65) Prior Publication Data

US 2024/0105898 A1 Mar. 28, 2024

(30) Foreign Application Priority Data

Sep. 23, 2022 (CN) .......................... 202211162364.0

(51) Int. Cl.
| | |
|---|---|
| *H10H 20/857* | (2025.01) |
| *H10H 20/81* | (2025.01) |
| *H10H 20/814* | (2025.01) |
| *H10H 20/855* | (2025.01) |
| *H10H 29/10* | (2025.01) |
| *H10H 20/80* | (2025.01) |

(52) U.S. Cl.
CPC ........ *H10H 20/857* (2025.01); *H10H 20/814* (2025.01); *H10H 20/8215* (2025.01); *H10H 20/855* (2025.01); *H10H 29/10* (2025.01); *H10H 20/872* (2025.01)

(58) Field of Classification Search
CPC .............. H10H 20/857; H10H 20/814; H10H 20/8215; H10H 20/855; H10H 29/10; H10H 20/872; H01L 25/0753; H05B 45/10; H05B 45/30; H05B 45/40
See application file for complete search history.

(56) References Cited

U.S. PATENT DOCUMENTS

| | | |
|---|---|---|
| 2021/0090487 A1 | 3/2021 | Chu et al. |
| 2021/0390914 A1 | 12/2021 | Fattal |
| 2022/0139999 A1 | 5/2022 | Yeon et al. |
| 2022/0381417 A1* | 12/2022 | Su .......................... F21V 23/003 |

FOREIGN PATENT DOCUMENTS

WO      2021249149      12/2021

OTHER PUBLICATIONS

"Search Report of Europe Counterpart Application", issued on Feb. 26, 2024, p. 1-p. 7.

* cited by examiner

*Primary Examiner* — David Vu
(74) *Attorney, Agent, or Firm* — JCIPRNET

(57) ABSTRACT

An electronic device is provided and includes a circuit substrate and a light emitting chip. The light emitting chip is disposed on the circuit substrate, and the light emitting chip includes a first light emitting diode and a second light emitting diode electrically connected to each other. The first light emitting diode has a first light distribution curve, the second light emitting diode has a second light distribution curve, and the first light distribution curve is different from the second light distribution curve.

20 Claims, 7 Drawing Sheets

ELECTRONIC DEVICE

CROSS-REFERENCE TO RELATED APPLICATION

This application claims the priority benefit of China application serial no. 202211162364.0, filed on Sep. 23, 2022. The entirety of the above-mentioned patent application is hereby incorporated by reference herein and made a part of this specification.

BACKGROUND

Technical Field

The disclosure relates to an electronic device.

Description of Related Art

The application fields of electronic devices are becoming more and more popular. Therefore, corresponding to different applications, the electronic devices need to provide different functions. For example, in different situations, electronic devices are required to provide different lighting effects. Therefore, the design of an electronic device is required to be continuously updated and/or adjusted.

SUMMARY

According to an embodiment of the disclosure, an electronic device includes a circuit substrate and a light emitting chip. The light emitting chip is disposed on the circuit substrate, and the light emitting chip includes a first light emitting diode and a second light emitting diode connected to each other. The first light emitting diode has a first light distribution curve, the second light emitting diode has a second light distribution curve, and the first light distribution curve is different from the second light distribution curve.

DETAILED DESCRIPTION OF DISCLOSED EMBODIMENTS

Figure 1:
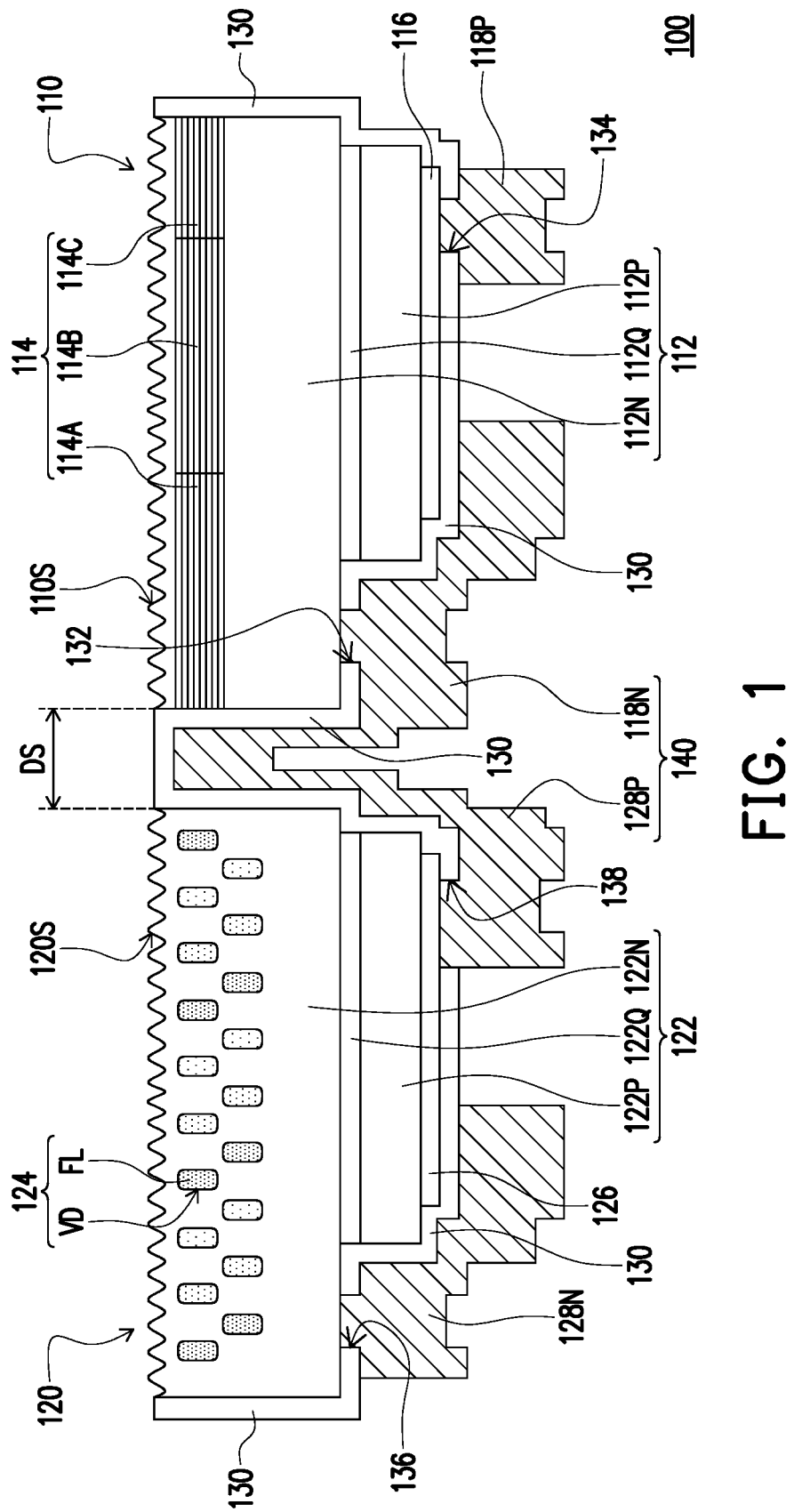
FIG. 1 is a schematic diagram of a light emitting chip disposed in an electronic device of an embodiment of the disclosure.

The disclosure may be understood by referring to the following detailed description in conjunction with the accompanying drawings. It should be noted that, for the ease of understanding by the readers and for the brevity of the accompanying drawings, multiple drawings in the disclosure only depict a portion of the electronic device, and the specific elements in the drawings are not drawn according to the actual scale. In addition, the number and size of each of the elements in the figures are for illustration purposes only, and are not intended to limit the scope of the disclosure.

Certain terms may be used throughout the disclosure and the appended claims to refer to specific elements. It should be understood by those skilled in the art that electronic apparatus manufacturers may refer to the same elements by different names. The disclosure does not intend to distinguish between elements that have the same function but have different names.

In the following description and claims, words such as "comprising" and "including" are open-ended words, so they should be interpreted as meaning "including but not limited to . . . ".

It should be understood that when an element or layer is referred to as being "disposed on" or "connected to" another element or layer, it may be directly on or directly connected to this other element or layer, or there may be an intervening element or layer in between (indirect case). In contrast, when an element is referred to as being "directly on" or "directly connected to" another element or layer, there are no intervening elements or layers present. When an element or layer is referred to as being "electrically connected" to another element or layer, it may be interpreted as being directly or indirectly electrically connected.

The terms "about", "equal to", "equal" or "same", "substantially" or "generally" are interpreted as within ±20% of a given value or range, or interpreted as within ±10%, ±5%, ±3%, ±2%, ±1%, or ±0.5% of the given value or range.

Although the terms "first", "second", "third" . . . may be used to describe various constituent elements, the constituent elements are not limited by the terms. The terms are only used to distinguish a single constituent element from other constituent elements in the specification. The same terms may not be used in the claim, but replaced by first, second, third . . . according to the order in which the elements are declared in the claim. Therefore, the first constituent element in the following description may be referred to as the second constituent element in the claim.

The electrical connection or coupling described in the disclosure may refer to direct connection or indirect connection. In the case of a direct connection, the terminal points of two elements on a circuit directly connect to each other, or connect to each other through a conductive wire. In the case of indirect connection, a switch, a diode, a capacitor, an inductor, a resistor, other suitable elements, or a combination thereof, but not limited therein, is between the terminal points of two elements on a circuit.

In the disclosure, the length, width, thickness, height, or area, or the distance or spacing between elements may be measured by using an optical microscope (OM), a scanning electron microscope (SEM), a film thickness profilometer ($\alpha$-step), an ellipsometer, or other suitable methods. In detail, according to some embodiments, a scanning electron microscope may be used to obtain a cross-sectional structure image including the component to be measured, and measure the width, thickness, height, or area of each component, or the distance or spacing between elements, but not limited thereto. Furthermore, the terms "a given range is from a first value to a second value", "a given range is within a range from the first value to the second value" means that the given range includes the first value, the second value, and other values in between. If a first direction is perpendicular to a second direction, an angle between the first direction and the second direction may be between 80 degrees and 100 degrees; if the first direction is parallel to the second direction, an angle between the first direction and the second direction may be between 0 degrees and 10 degrees.

Unless otherwise defined, all terms (including technical and scientific terms) used herein may have the same meaning as commonly understood by one of ordinary skill in the art to which this disclosure belongs. It is understood that these terms, such as those defined in commonly used dictionaries, should be interpreted as having meanings consistent with the relevant art and the background or context of the disclosure, and should not be interpreted in an idealized or overly formal manner, unless otherwise defined in the embodiments of the disclosure.

In the disclosure, an electronic device may include a display device, a light emitting device, a sensing device, or a splicing device, but not limited thereto. The electronic device may be a bendable or flexible electronic device. The display device may be a non-self-luminous display device or a self-luminous display device. The sensing device may be a sensing device for sensing capacitance, light, heat or ultrasonic waves, but not limited thereto. In the disclosure, electronic parts may include passive elements and active elements, such as a chip, a capacitor, a resistor, an inductor, a diode, a transistor, and the like. The diode may include a light emitting diode (LED) or a photodiode, but not limited thereto. The light emitting diode may include, for example, an organic light emitting diode (OLED), a mini light emitting diode (mini LED), a micro light emitting diode (micro LED), or a quantum dot light emitting diode (quantum dot LED), but not limited thereto. In the disclosure, a display panel may include self-luminous or non-self-luminous panels. The self-luminous panel may include, for example, an organic light emitting diode (OLED), a mini light emitting diode (mini LED), or a micro light emitting diode (micro LED), but not limited thereto. The non-self-luminous panel includes, for example, liquid crystal, or other suitable materials. It should be noted that, the electronic device may be any arrangement and combination of the foregoing, but not limited thereto. Hereinafter, a splicing device is used to illustrate the disclosure, but the disclosure is not limited thereto.

It should be noted that the technical solutions provided by the different embodiments hereinafter may be replaced, combined, or mixed with one another, so as to constitute another embodiment without violating the spirit of the disclosure.

FIG. 1 is a schematic diagram of a light emitting chip disposed in an electronic device of an embodiment of the disclosure. In FIG. 1, a light emitting chip 100 includes a first light emitting diode 110 and a second light emitting diode 120 connected to each other. In this embodiment, the light emitting chip 100 may further include a protective layer 130 covering the first light emitting diode 110 and the second light emitting diode 120. The material of the protective layer 130 may include dielectric materials, such as silicon oxide, silicon nitride, silicon oxynitride, and the like. The protective layer 130 may be continuously extended between the first light emitting diode 110 and the second light emitting diode 120, so as to wrap the first light emitting diode 110 and the second light emitting diode 120 into a single light emitting chip 100. In some embodiments, the first light emitting diode 110 and the second light emitting diode 120 may be fabricated on the same substrate with a spacing distance DS between them, so that the light emitting chip 100 has a small volume. In some embodiments, the spacing distance DS, for example, may be less than or equal to 10 mm (0<DS≤10 mm).

The first light emitting diode 110 and the second light emitting diode 120 have different characteristics. For example, the first light emitting diode 110 has a first light distribution curve, the second light emitting diode 120 has a second light distribution curve, and the first light distribution curve is different from the second light distribution curve. In this way, the first light emitting diode 110 and the second light emitting diode 120 integrated into a single light emitting chip 100 may provide a composite light distribution effect to meet different usage requirements. In some embodiments, multiple light emitting chips 100 may be arranged in an array and applied to an electronic device to provide the function of displaying an image, thereby realizing a display panel, a display, and the like.

Figure 7:
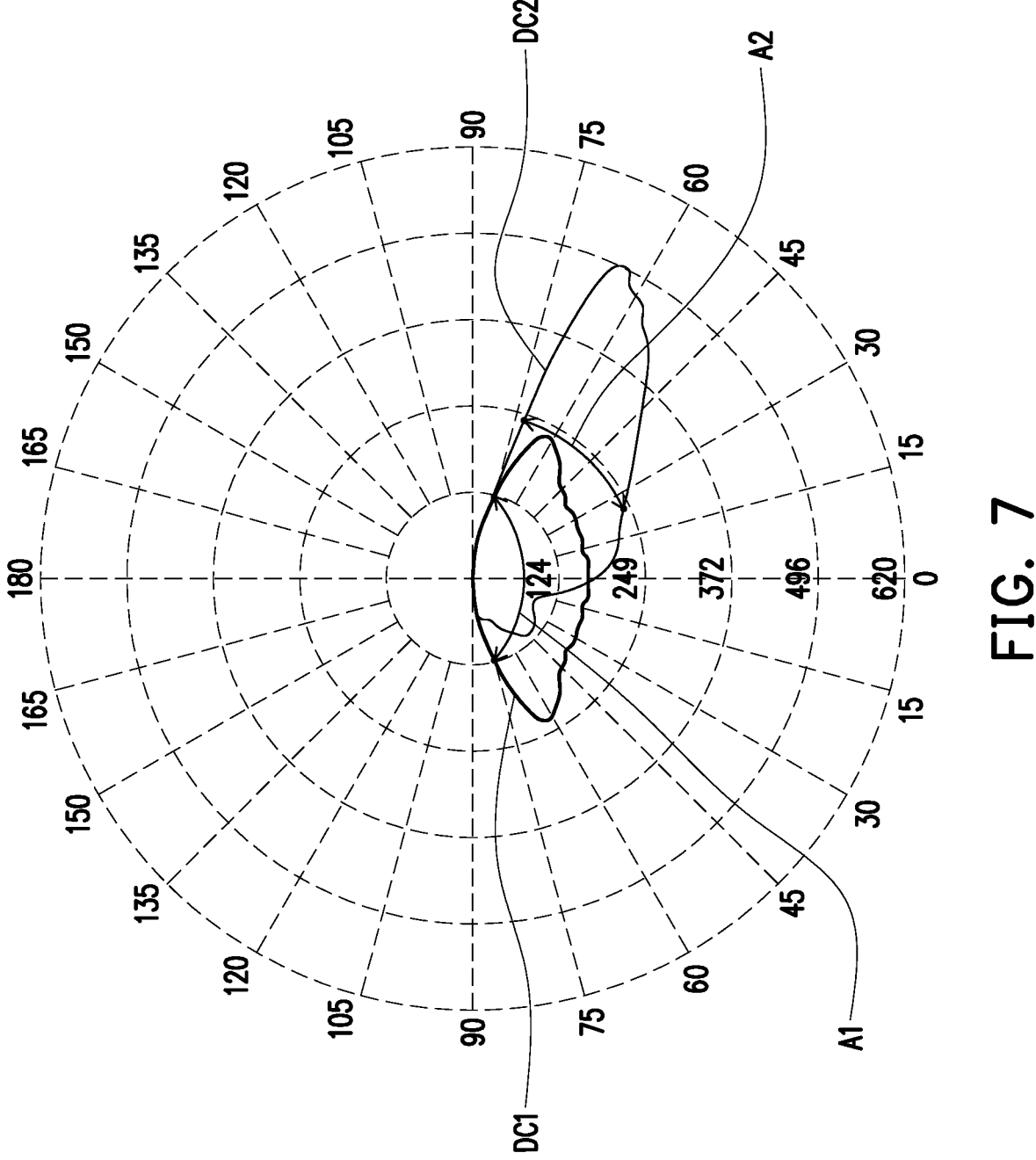
FIG. 7 is a simulation diagram of the light emitting effect of the light emitting chip of an embodiment of the disclosure.

As shown in FIG. 7, in some embodiments, the first light distribution curve of the first light emitting diode 110 has a maximum brightness at a first angle, and the second light distribution curve of the second light emitting diode 120 has a maximum brightness at a second angle, and the first angle is different from the second angle. In this way, the electronic device using the light emitting chip 100 may provide corresponding display brightness at the first angle and the second angle according to the usage requirements. In some embodiments, the first light distribution curve of the first light emitting diode 110 has a first beam angle corresponding to 50% of the maximum brightness, the second light distribution curve of the second light emitting diode 120 has a second beam angle corresponding to 50% of the maximum brightness, and the first beam angle and the second beam angle may fall in different angle intervals. In this way, the electronic device using the light emitting chip 100 may display corresponding display brightness in different angle intervals.

The first light emitting diode 110 includes a first semiconductor stack 112 and a one-dimensional photonic crystal 114, in which the one-dimensional photonic crystal 114 is disposed on the first semiconductor stack 112. For example, the first semiconductor stack 112 includes a first semiconductor layer 112N, a light emitting layer 112Q and a second semiconductor layer 112P, and the light emitting layer 112Q is disposed between the first semiconductor layer 112N and the second semiconductor layer 112P. The first semiconductor layer 112N and the second semiconductor layer 112P have different conductivity types. In some embodiments, the first semiconductor layer 112N is, for example, an N-type semiconductor layer, and the second semiconductor layer 112P is, for example, a P-type semiconductor layer, but not limited thereto. The light emitting layer 112Q includes, for example, a single-layer quantum well or a multi-layer quantum well structure. The one-dimensional photonic crystal 114 is disposed on the first semiconductor layer 112N of the first semiconductor stack 112. In other words, the one-dimensional photonic crystal 114 and the light emitting layer 112Q are located on opposite sides of the first semiconductor layer 112N. Alternatively, the one-dimensional photonic crystal 114 is separated from the light emitting layer 112Q by the first semiconductor layer 112N. In some embodiments, the one-dimensional photonic crystal 114 may be embedded in the first semiconductor layer 112N. That is, a portion of the first semiconductor layer 112N exists between the one-dimensional photonic crystal 114 and the light emitting surface 110S of the first light emitting diode 110. Therefore, the one-dimensional photonic crystal 114 may not be exposed on the light emitting surface 110S.

As shown in FIG. 1, the lateral dimension of the first semiconductor layer 112N exceeds the lateral dimension of the second semiconductor layer 112P so that the first light emitting diode 110 forms a stepped structure, but not limited thereto. The first light emitting diode 110 further includes an ohmic contact layer 116 disposed on the surface of the second semiconductor layer 112P. The protective layer 130 has an opening 132 and an opening 134. The first light emitting diode 110 further includes an electrode 118N and an electrode 118P. The electrode 118N and the electrode 118P are disposed on the protective layer 130 and separated from each other to avoid short circuit between the two. The electrode 118N fills the opening 132 and contacts the first semiconductor layer 112N to be electrically connected to the first semiconductor layer 112N, and the electrode 118P fills the opening 134 and is electrically connected to the second semiconductor layer 112P through the ohmic contact layer 116. Here, the electrode 118N may be understood as an N pole, and the electrode 118P may be understood as a P pole. In some embodiments, the surface of the first semiconductor layer 112N may be further provided with an ohmic contact layer (not shown), and the electrode 118N filling the opening 132 may contact the ohmic contact layer on the first semiconductor layer 112N. In some embodiments, the ohmic contact layer 116 may be omitted so that the electrode 118P directly contacts the second semiconductor layer 112P at the opening 134.

The one-dimensional photonic crystal 114 may include multiple patterned Bragg reflective layers 114A, 114B, and 114C. It should be noted that each of the Bragg reflective layers 114A, 114B, and 114C includes multiple sub-layers. Two adjacent sub-layers may have different dielectric coefficients, and adjacent Bragg reflective layers may respectively have different combinations of sub-layers, such as adopting sub-layer materials with different dielectric coefficients, different number of sub-layers, and/or different arrangement sequences of sub-layers, etc. In some embodiments, the selectable materials for the sub-layers of each of the Bragg reflective layers 114A, 114B, and 114C include, for example, aluminum oxide ($Al_2O_3$), silicon oxide (SiO), silicon nitride (SiN), etc., but not limited thereto. The dielectric coefficient of the above materials may be further adjusted through a specific process. In some embodiments, two adjacent sub-layers in each of the Bragg reflective layers 114A, 114B, and 114C are materials with different dielectric coefficients. In some embodiments, the thickness of each sub-layer of each of the Bragg reflective layers 114A, 114B, and 114C may fall within the wavelength range of visible light, for example, 400 nanometers (nm) to 700 nanometers (nm) (400 nanometers≤sub-layer thickness≤700 nm). In some embodiments, the number of Bragg reflective layers 114A, 114B, and 114C disposed in the first light emitting diode 110 may be greater than 3 or less than 3, and is not limited to the number shown in the drawing.

In addition, the first light emitting diode 110 has a light emitting surface 110S, and the protective layer 130 does not cover the light emitting surface 110S so that the light emitting surface 110S is exposed. In this embodiment, the light emitting surface 110S may have multiple protrusions, for example, presenting a prism-shaped outline, but not limited thereto. The electrodes 118P and 118N of the first light emitting diode 110 may be connected to corresponding pixel circuits to generate a driving current in the first light emitting diode 110 so that the light emitting layer 112Q emits light. The light emitted from the light emitting layer 112Q may pass through the one-dimensional photonic crystal 114 while traveling toward the light emitting surface 110S. Each sub-layer in the one-dimensional photonic crystal 114 may be arranged according to a specific rule according to requirements, so as to affect the progress of light. That is, the one-dimensional photonic crystal 114 may distribute the distribution of light. Therefore, the first light distribution curve of the first light emitting diode 110 may be determined by the properties in regards to light of the one-dimensional photonic crystal 114.

The second light emitting diode 120 includes a second semiconductor stack 122 and a two-dimensional photonic crystal 124, in which the two-dimensional photonic crystal 124 is disposed on the second semiconductor stack 122. For example, the second semiconductor stack 122 includes a first semiconductor layer 122N, a light emitting layer 122Q and a second semiconductor layer 122P, and the light emitting layer 122Q is disposed between the first semiconductor layer 122N and the second semiconductor layer 122P. The first semiconductor layer 122N and the second semiconductor layer 122P have different conductivity types. In some embodiments, the first semiconductor layer 122N is, for example, an N-type semiconductor layer, and the second semiconductor layer 122P is, for example, a P-type semiconductor layer, but not limited thereto. The light emitting layer 122Q includes, for example, a single-layer quantum well or a multi-layer quantum well structure. The two-dimensional photonic crystal 124 is disposed on a side of the first semiconductor layer 122N of the second semiconductor stack 122 distant from the light emitting layer 122Q. In other words, the two-dimensional photonic crystal 124 and the light emitting layer 122Q are located on opposite sides of the first semiconductor layer 122N. Alternatively, the two-dimensional photonic crystal 124 is separated from the light emitting layer 122Q by the first semiconductor layer 122N. In some embodiments, the two-dimensional photonic crystal 124 may be embedded in the first semiconductor layer 122N. In other words, a portion of the first semiconductor layer 122N exists between the two-dimensional photonic crystal 124 and the light emitting surface 120S of the second light emitting diode 120. Therefore, the two-dimensional photonic crystal 124 may not be exposed on the light emitting surface 120S. In some other embodiments, there may be another light-transmitting layer (not shown) between the first semiconductor layer 122N of the second light emitting diode 120 and the light emitting surface 120S, and the two-dimensional photonic crystal may be disposed on the light-transmitting layer.

As shown in FIG. 1, the lateral dimension of the first semiconductor layer 122N exceeds the lateral dimension of the second semiconductor layer 122P so that the second light emitting diode 120 forms a stepped structure, but not limited thereto. The second light emitting diode 120 further includes an ohmic contact layer 126 disposed on the surface of the second semiconductor layer 122P. The protective layer 130 has an opening 136 and an opening 138. The second light emitting diode 120 further includes an electrode 128N and an electrode 128P. The electrode 128N and the electrode 128P are disposed on the protective layer 130 and separated from each other to avoid short circuit between the two. The electrode 128N fills the opening 136 and contacts the first semiconductor layer 122N to be electrically connected to the first semiconductor layer 122N, and the electrode 128P fills the opening 138 and is electrically connected to the second semiconductor layer 122P through the ohmic contact layer 126. Herein, the electrode 128N may be understood as an N pole, and the electrode 128P may be understood as a P pole. In some embodiments, the first semiconductor layer 122N may be further provided with an ohmic contact layer (not shown), and the electrode 128N filling the opening 136 may contact the ohmic contact layer on the first semiconductor layer 122N. In some embodiments, the ohmic contact layer 126 may be omitted so that the electrode 128P directly contacts the second semiconductor layer 122P at the opening 138.

In FIG. 1, the first light emitting diode 110 and the second light emitting diode 120 are connected in series and located in the same sub-pixel. The electrode 118N (N pole) of the first light emitting diode 110 is electrically connected to the electrode 128P (P pole) of the second light emitting diode 120. Specifically, the electrode 118N of the first light emitting diode 110 and the electrode 128P of the second light emitting diode 120 may be integrated into an integrated electrode 140. In other words, the integrated electrode 140 has an integrated structure and may be connected to the first semiconductor layer 112N of the first light emitting diode 110 through the opening 132 and connected to the second semiconductor layer 122P of the second light emitting diode 120 through the opening 138. Thereby, the first light emitting diode 110 and the second light emitting diode 120 are connected in series by using the integrated electrode 140. In other words, the electrode 118N of the first light emitting diode 110 and the electrode 128P of the second light emitting diode 120 may be different portions of the integrated electrode 140.

The two-dimensional photonic crystal 124 may include multiple voids VD and materials FL having different dielectric coefficients filled in the voids VD. The voids VD may be arranged in an array or randomly distributed. In some embodiments, the feature length of the void VD (e.g., the diameter of the void VD, if the void VD is not spherical, the longest distance between any two points on the internal surface of the void VD is referred to as the feature length of the void VD) may fall within the wavelength range of visible light, for example, 400 nm to 700 nm (400 nm≤feature length≤700 nm). The material FL filled in the void VD may be selected from the sub-layer materials used for the one-dimensional photonic crystal 114. The materials FL filled in at least two voids VD may have different dielectric coefficients. In the drawings of the disclosure, the voids VD are filled with three different densities of dots to schematically represent that the materials FL in different voids VD have different dielectric coefficients. However, these drawings are used for illustration only, and are not used to limit the embodiments of the disclosure. In some embodiments, the void structure filled with the material FL and distributed in the first semiconductor layer 122N may be understood as the two-dimensional photonic crystal 124. In some embodiments, at least a portion of the voids VD may be voids VD without a filler. The arrangement of the two-dimensional photonic crystals 124 may affect the traveling direction of light and may be configured to determine the second light distribution curve of the second light emitting diode 120.

In addition, the second light emitting diode 120 has a light emitting surface 120S, and the protective layer 130 does not cover the light emitting surface 120S so that the light emitting surface 120S is exposed. In this embodiment, the light emitting surface 120S may be a rough surface or a prism surface with multiple protrusions, but not limited thereto. The electrodes 128P and 128N of the second light emitting diode 120 may be connected to corresponding pixel circuits to generate a driving current in the second light emitting diode 120 so that the light emitting layer 122Q emits light. The light emitted from the light emitting layer 122Q may pass through the two-dimensional photonic crystal 124 while traveling toward the light emitting surface 120S. The two-dimensional photonic crystals 124 may be distributed with a specific rule according to requirements, thereby affecting the progress of light. In other words, the two-dimensional photonic crystal 124 may distribute the distribution of light. Therefore, the second light distribution curve of the second light emitting diode 120 may be determined by the properties in regards to light of the two-dimensional photonic crystal 124.

In the light emitting chip 100, the first light distribution curve of the first light emitting diode 110 may be adjusted by the one-dimensional photonic crystal 114, and the second light distribution curve of the second light emitting diode 120 may be adjusted by the two-dimensional photonic crystal 124. Therefore, the first light distribution curve of the first light emitting diode 110 is different from the second light distribution curve of the second light emitting diode 120, so that the overall lighting effect of the light emitting chip 100 is not limited by the structure of a single light emitting diode. In addition, the spacing distance DS between the first light emitting diode 110 and the second light emitting diode 120 forming the light emitting chip 100 is small, so that the light emitting chip 100 has a smaller volume.

Figure 2:
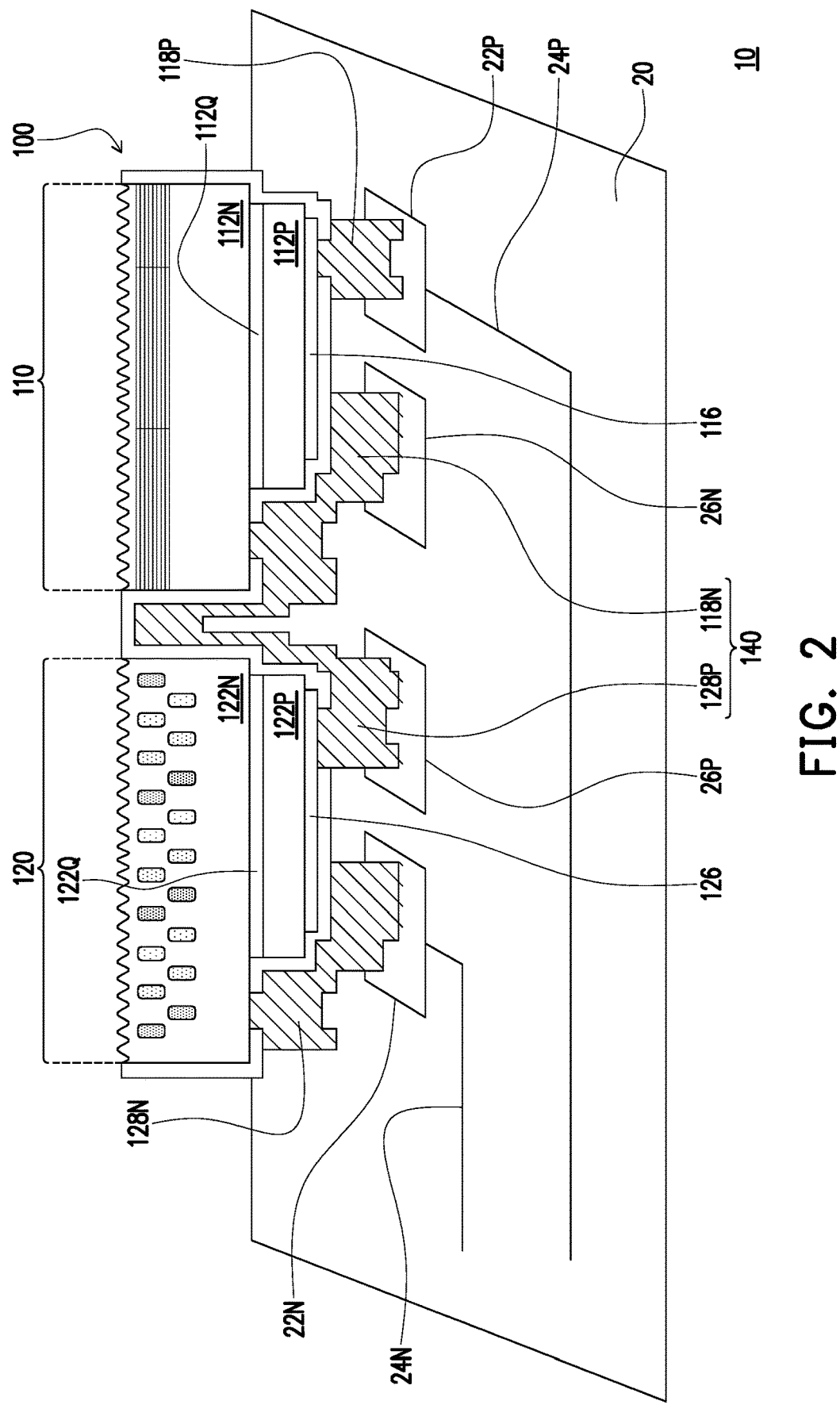
FIG. 2 is a schematic diagram of an electronic device of an embodiment of the disclosure.

FIG. 2 is a schematic diagram of an electronic device of an embodiment of the disclosure. The electronic device 10 in FIG. 2 includes a circuit substrate 20 and a light emitting chip 100. The light emitting chip 100 is disposed on the circuit substrate 20, and the light emitting chip 100 is the light emitting chip 100 described in FIG. 1. Therefore, the specific structure of the light emitting chip 100 may refer to the related description of FIG. 1. Referring to FIG. 1 and FIG. 2, the light emitting chip 100 may include a first light emitting diode 110 and a second light emitting diode 120 connected in series. The electrode 118N of the first light emitting diode 110 is connected to the electrode 128P of the second light emitting diode 120 to form an integrated electrode 140, to realize the series connection of the first light emitting diode 110 and the second light emitting diode 120. In this embodiment, the circuit substrate 20 may have a pad 22N, a pad 22P, a transmission line 24N connected to the pad 22N, and a transmission line 24P connected to the pad 22P. The electrode 118P of the first light emitting diode 110 is bonded to the pad 22P, and the electrode 128N of the second light emitting diode 110 is bonded to the pad 22N. The circuit substrate 20 may transmit electrical signals to the pad 22N and the pad 22P through the transmission line 24N and the transmission line 24P, thereby generating a driving current in the light emitting chip 100 so that the first light emitting diode 110 and the second light emitting diode 120 emit light. The driving current may be transmitted between the pad 22N and the pad 22P through the electrode 128N of the second light emitting diode 120, the first semiconductor layer 122N of the second light emitting diode 120, the light emitting layer 122Q of the second light emitting diode 120, the second semiconductor layer 122P of the second light emitting diode 120, the ohmic contact layer 116 of the second light emitting diode 126, an integrated electrode 140 (including the electrode 128P of the second light emitting diode 120 and the electrode 118N of the first light emitting diode 110), the first semiconductor layer 112N of the first light emitting diode 110, the light emitting layer 112Q of the first light emitting diode 110, the second semiconductor layer 112P of the first light emitting diode 110, the ohmic contact layer 116 of the first light emitting diode 110, and the electrode 118P of the first light emitting diode 110.

In addition, the circuit substrate 20 may further include a pad 26N and a pad 26P. The electrode 118N of the first light emitting diode 110 may be bonded to the pad 26N, and the electrode 128P of the second light emitting diode 120 may be bonded to the pad 26P. The pad 26N and the pad 26P may be pads that are not connected to other pixel circuits. In some embodiments, bonding the electrode 118N to the pad 26N and the electrode 128N to the pad 26P facilitates stabilizing the connection between the light emitting chip 100 and the circuit substrate 20. In some embodiments, at least one of the pad 26N and the pad 26P may be omitted, or integrated into a single pad pattern.

Figure 3:
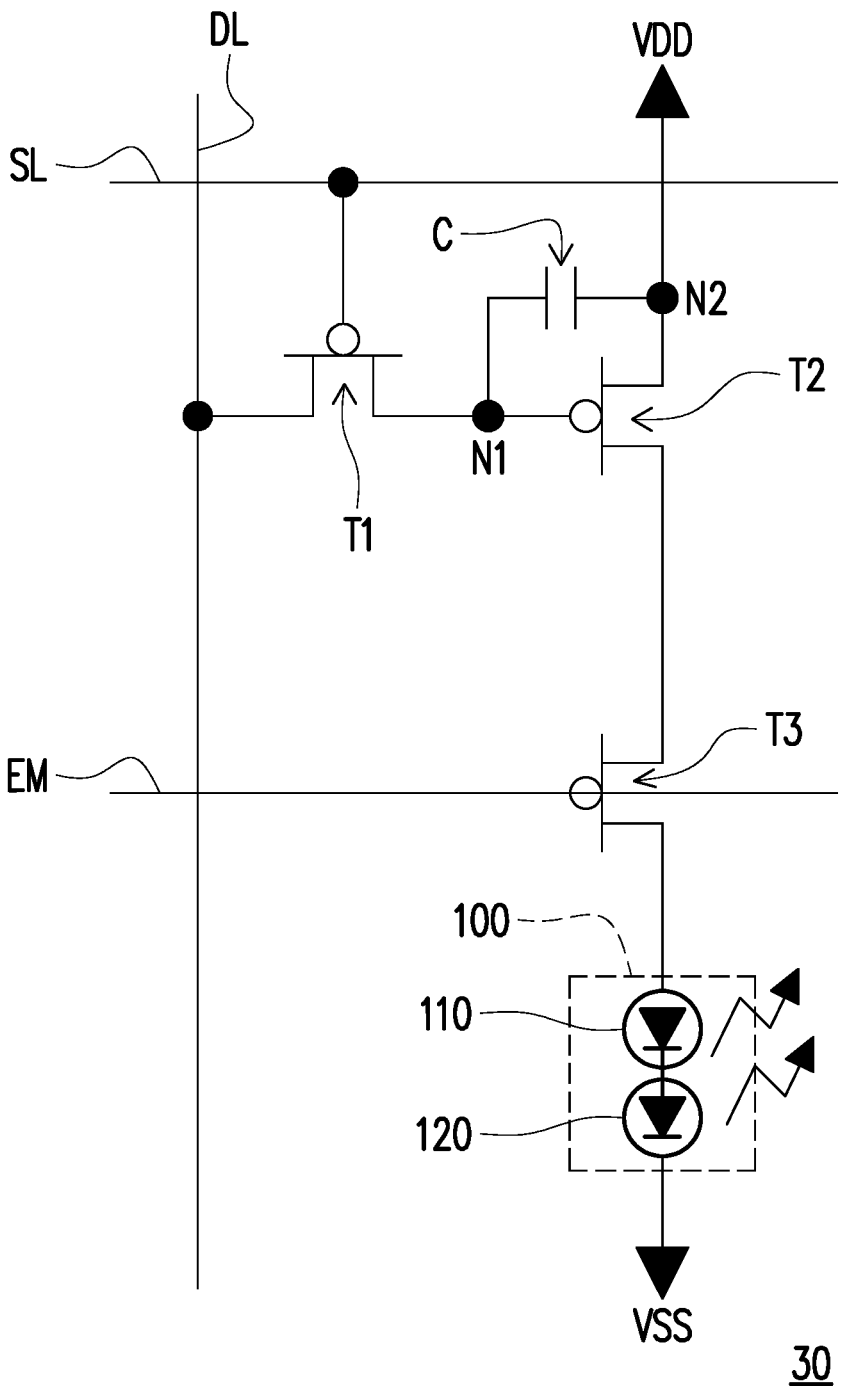
FIG. 3 is a schematic diagram of a pixel circuit of an embodiment of the disclosure.

In this embodiment, the circuit substrate 20 further includes the pixel circuit 30 shown in FIG. 3, and the transmission line 24N and the transmission line 24P may be configured to electrically connect the pixel circuit 30 to the first light emitting diode 110 and the second light emitting diode 120 connected in series of the light emitting chip 100. FIG. 3 is a schematic diagram of a pixel circuit of an embodiment of the disclosure. The pixel circuit 30 may be connected to the scan line SL, the data line DL and the control line EM, and includes a transistor T1, a transistor T2, a transistor T3 and a capacitor C. Here, the pixel circuit 30 is a driving circuit with three transistors and one capacitor (3T1C), but not limited thereto. The gate of the transistor T1 is connected to the scan line SL, and the other two terminals are respectively connected to the data line DL and the node N1. The two terminals of the capacitor C are respectively connected to the node N1 and the node N2. The node N2 may be connected to a power supply VDD. The gate of the transistor T2 is connected to the node N1, and the other two terminals are respectively connected to the node N2 and the transistor T3, that is, the two terminals of the capacitor C are respectively electrically connected to the gate of the transistor T2 and one of the other two terminals of transistor T2. The gate of the transistor T3 is connected to the control line EM, and the other two terminals are respectively connected to the transistor T2 and the light emitting chip 100. One terminal of the light emitting chip 100 (e.g., an electrode of one of the first light emitting diode 110 and the second light emitting diode 120) is connected to the transistor T3, and the other terminal (e.g., an electrode of the other one of the first light emitting diode 110 and the second light emitting diode 120) is connected to the power supply VSS. In this way, the pixel circuit 30 may be electrically connected to the first light emitting diode 110 and the second light emitting diode 120 connected in series to provide a driving current so that the first light emitting diode 110 and the second light emitting diode 120 emit light.

Figure 4:
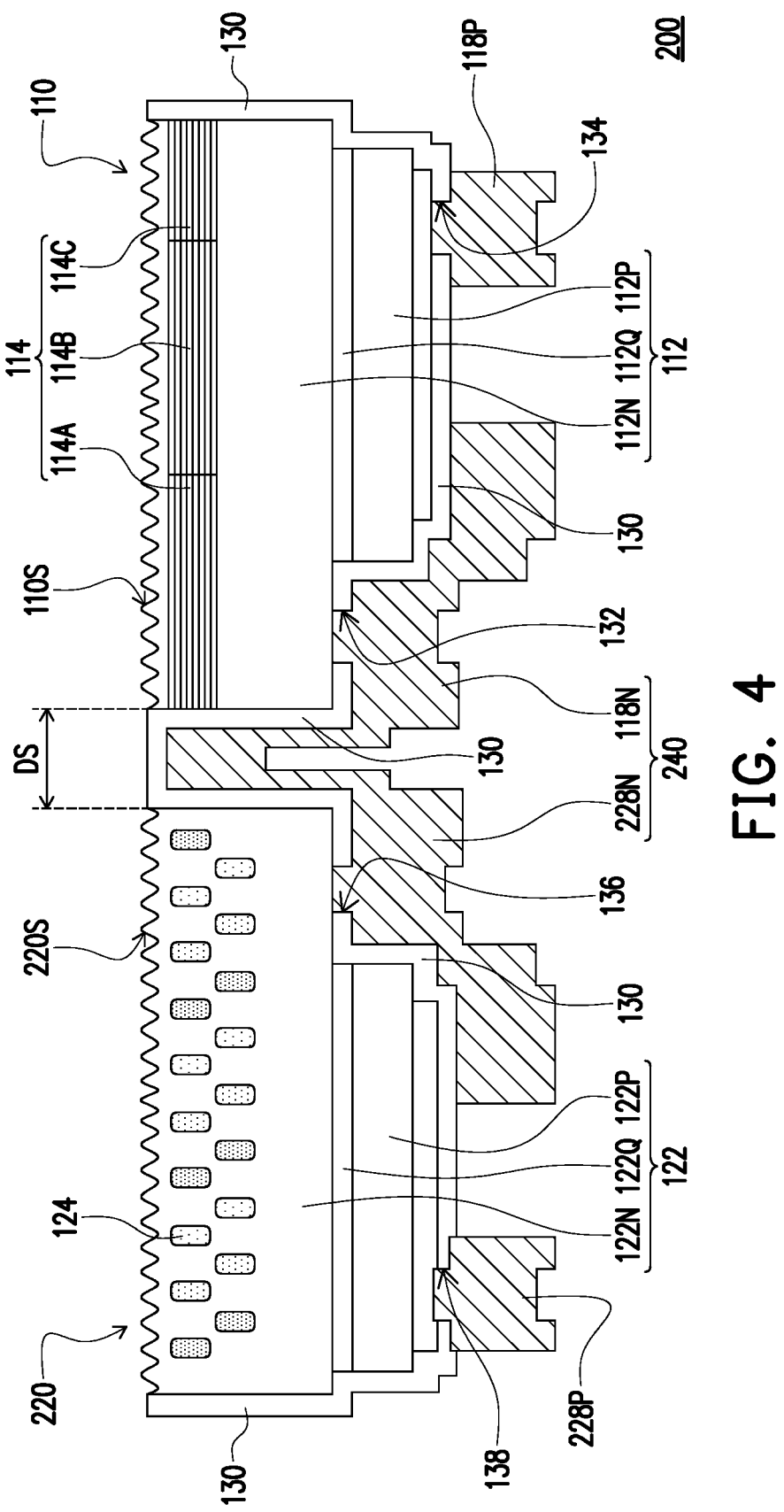
FIG. 4 is a schematic diagram of a light emitting chip disposed in an electronic device of an embodiment of the disclosure.

FIG. 4 is a schematic diagram of a light emitting chip disposed in an electronic device of an embodiment of the disclosure. In FIG. 4, the light emitting chip 200 is similar to the aforementioned light emitting chip 100 and includes a first light emitting diode 110 and a second light emitting diode 220. Since the first light emitting diode 110 in this embodiment may be the same or similar in structure to the first light emitting diode 110 in FIG. 1, the second light emitting diode 220 may be similar in structure to the second light emitting diode 120 in FIG. 1. Therefore, details of each portion of the first light emitting diode 110 and the second light emitting diode 120 in this embodiment are not repeated herein. In this embodiment, the first light emitting diode 110 has a first light distribution curve, the second light emitting diode 220 has a second light distribution curve, and the first light distribution curve is different from the second light distribution curve. Therefore, the overall light emitting effect of the light emitting chip 200 may not be limited to the design of a single light emitting diode.

In some embodiments, the first light distribution curve of the first light emitting diode 110 has a maximum brightness at a first angle, and the second light distribution curve of the second light emitting diode 220 has a maximum brightness at a second angle, and the first angle is different from the second angle. In some embodiments, the first light distribution curve of the first light emitting diode 110 has a first beam angle corresponding to 50% of the maximum brightness, the second light distribution curve of the second light emitting diode 220 has a second beam angle corresponding to 50% of the maximum brightness, and the first beam angle and the second beam angle may have different angle ranges. In this way, the electronic device using the light emitting chip 100 may display corresponding display brightness in different angle intervals. Designers may use the designs of the first light emitting diode 110 and the second light emitting diode 220 to realize different light emitting effects.

The main difference between the light emitting chip 200 in this embodiment and the light emitting chip 100 in FIG. 1 is that the electrode 118N of the first light emitting diode 110 and the electrode 228N of the second light emitting diode 220 may be integrated into an integrated electrode 240. That is, the first semiconductor layer 112N of the first light emitting diode 110 is disposed adjacent to the second semiconductor layer 122N of the second light emitting diode 220, and is electrically connected through the integrated electrode 240. In this way, the first light emitting diode 110 and the second light emitting diode 220 may form a common electrode double crystal grain structure. In other embodiments, the first light emitting diode 110 and the second light emitting diode 220 may be flipped laterally, so that the P pole of the first light emitting diode 110 and the P pole of the second light emitting diode 220 are disposed adjacent to each other, and the P pole of the first light emitting diode 110 may be electrically connected to the P pole of the second light emitting diode 220, thereby forming another type of common electrode double crystal grain structure.

Figure 5:
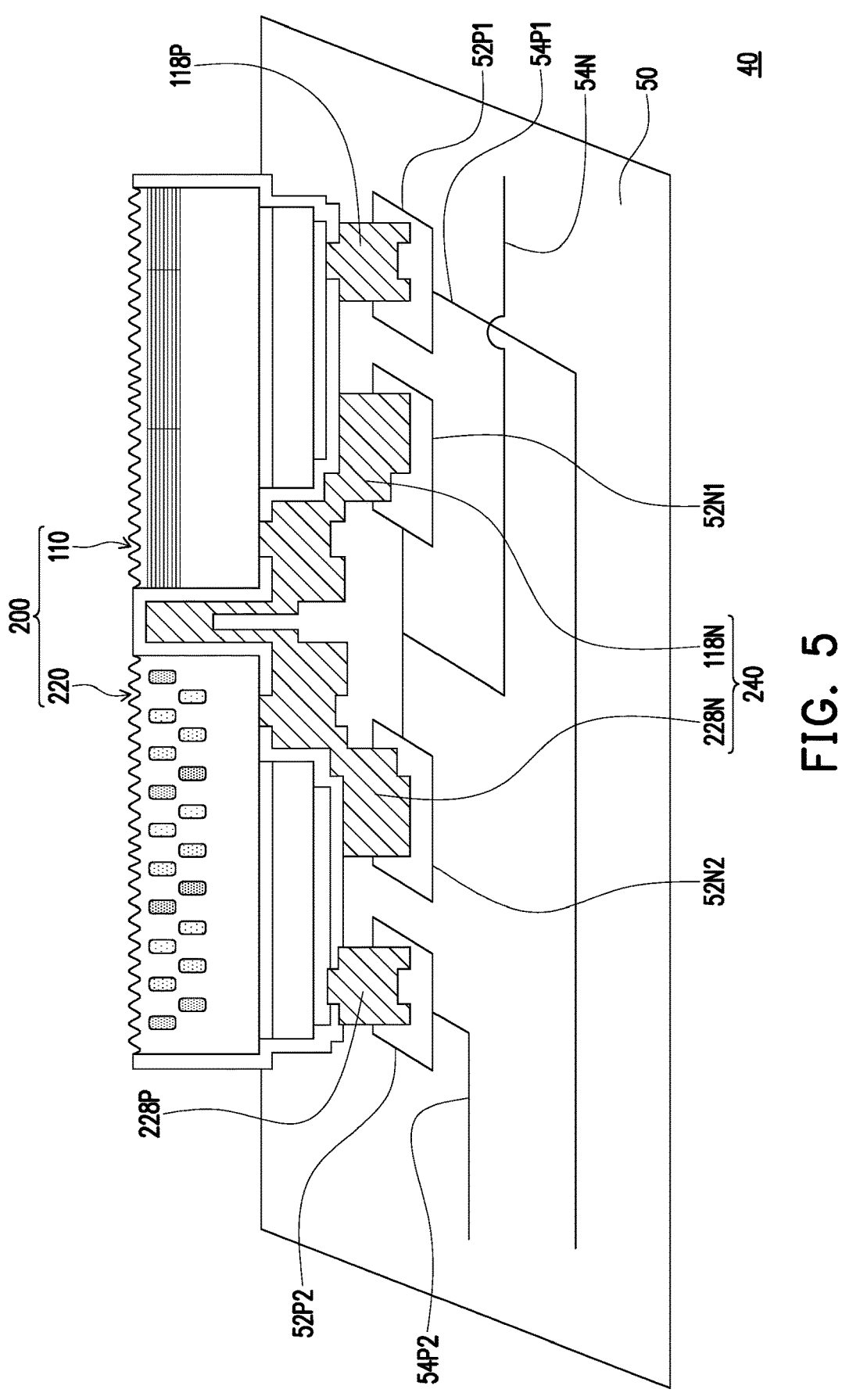
FIG. 5 is a schematic diagram of an electronic device of an embodiment of the disclosure.

FIG. 5 is a schematic diagram of an electronic device of an embodiment of the disclosure. The electronic device 40 in FIG. 5 includes a circuit substrate 50 and a light emitting chip 200. The light emitting chip 200 is disposed on the circuit substrate 50, and the light emitting chip 200 is the light emitting chip 200 described in FIG. 4. Therefore, the specific structure of the light emitting chip 200 may refer to the related description of FIG. 1. In FIG. 5, the circuit substrate 50 may include a pad 52N1, a pad 52N2, a pad 52P1, and a pad 52P2. The pad 52N1 is disposed as a pair with the pad 52P1, and the pad 52N2 is disposed as a pair with the pad 52P2. The light emitting chip 200 includes a first light emitting diode 110 and a second light emitting diode 220. The electrode 118P of the first light emitting diode 110 is connected to the pad 52P1, and the electrode 118N of the first light emitting diode 110 is connected to the pad 52N1. In addition, the electrode 228P of the second light emitting diode 220 is connected to the pad 52P2, and the electrode 228N of the second light emitting diode 220 is connected to the pad 52N2.

Figure 6:
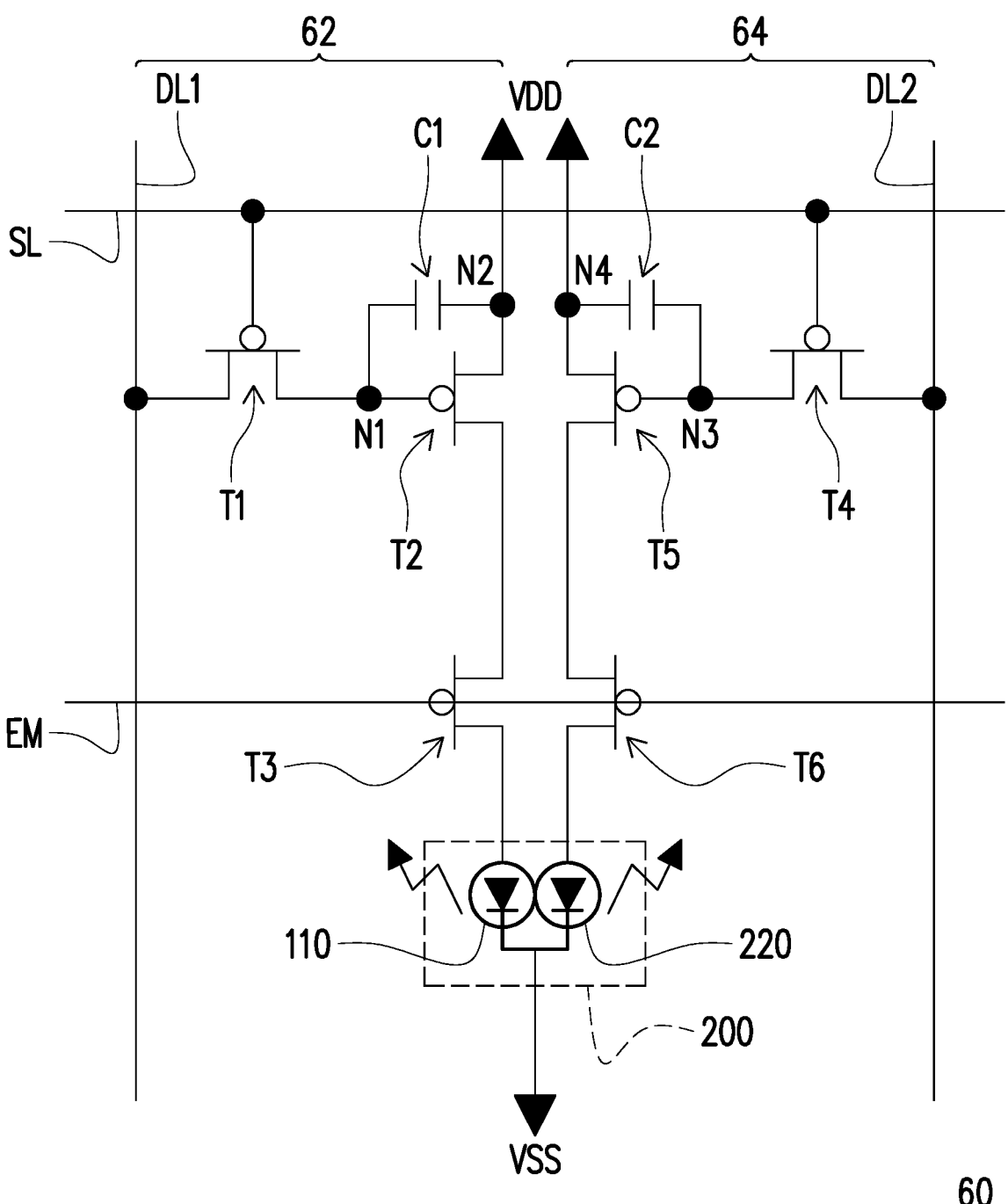
FIG. 6 is a schematic diagram of a pixel circuit disposed on a circuit substrate of an embodiment of the disclosure.

The circuit substrate 50 further includes a transmission line 54N, a transmission line 54P1, and a transmission line 54P2. The transmission line 54N is connected to the pad 52N1 and the pad 52N2. That is, the pad 52N1 and the pad 52N2 share the transmission line 54N. The transmission line 54P1 and the transmission line 54P2 are respectively connected to the pad 52P1 and the pad 52P2. The transmission line 54N, the transmission line 54P1 and the transmission line 54P2 may be configured to connect the first light emitting diode 110 and the second light emitting diode 220 to corresponding pixel circuits. FIG. 6 is a schematic diagram of a pixel circuit disposed on a circuit substrate of an embodiment of the disclosure. The pixel circuit 60 in FIG. 6 may be, for example, applied to the electronic device 40 in FIG. 5 and specifically disposed in the circuit substrate 50 to drive the first light emitting diode 110 and the second light emitting diode 220 of the light emitting chip 200. The pixel circuit 60 may include a first pixel circuit 62 and a second pixel circuit 64, the first pixel circuit 62 is electrically connected to the first light emitting diode 110 and the second pixel circuit 64 is electrically connected to the second light emitting diode 220. It should be noted that, in some embodiments, a sub-pixel may include both the first pixel circuit 62 and the second pixel circuit 64, while in other embodiments, a sub-pixel only includes one of the first pixel circuit 62 and the second pixel circuit 64.

The first pixel circuit 62 may be connected to the scan line SL, the data line DL1 and the control line EM, and includes a transistor T1, a transistor T2, a transistor T3 and a capacitor C1. Here, the first pixel circuit 62 is a driving circuit with three transistors and one capacitor (3T1C), but not limited thereto. The gate of the transistor T1 is connected to the scan line SL, and the other two terminals are respectively connected to the data line DL1 and the node N1. The two terminals of the capacitor C1 are respectively connected to the node N1 and the node N2. The node N2 may be connected to a power supply VDD. The gate of the transistor T2 is connected to the node N1, and the other two terminals are respectively connected to the node N2 and the transistor T3, that is, the two terminals of the capacitor C1 are respectively electrically connected to the gate of the transistor T2 and one of the other two terminals of transistor T2. The gate of the transistor T3 is connected to the control line EM, and the other two terminals are respectively connected to the transistor T2 and the first light emitting diode 110 of the light emitting chip 200. One terminal (e.g., the electrode 118P) of the first light emitting diode 110 is connected to the transistor T3, and the other terminal (e.g., the electrode 118N) is connected to the power supply VSS.

Similarly, the second pixel circuit 64 may be connected to the scan line SL, the data line DL2 and the control line EM, and includes a transistor T4, a transistor T5, a transistor T6, and a capacitor C2. Here, the second pixel circuit 64 is a driving circuit with three transistors and one capacitor (3T1C), but not limited thereto. The gate of the transistor T4 is connected to the scan line SL, and the other two terminals are respectively connected to the data line DL2 and the node N3. The two terminals of the capacitor C2 are respectively connected to the node N3 and the node N4. The node N4 may be connected to a power supply VDD. The gate of the transistor T5 is connected to the node N3, and the other two terminals are respectively connected to the node N4 and the transistor T6, that is, the two terminals of the capacitor C2 are respectively electrically connected to the gate of the transistor T5 and one of the other two terminals of transistor T5. The gate of the transistor T6 is connected to the control line EM, and the other two terminals are respectively connected to the transistor T5 and the second light emitting diode 220 of the light emitting chip 200. One terminal (e.g., the electrode 228P) of the second light emitting diode 220 is connected to the transistor T6, and the other terminal (e.g., the electrode 228N) is connected to the power supply VSS.

Referring to FIG. 5 and FIG. 6, the pad 52P1 and the transmission line 54P1 may be configured to electrically connect the electrode 118P of the first light emitting diode 110 to the transistor T3 of the first pixel circuit 62. The pad 52P2 and the transmission line 54P2 may be used to electrically connect the electrode 228P of the second light emitting diode 220 to the transistor T6 of the second pixel circuit 64. In addition, the transmission line 54N may be configured to electrically connect the electrode 118N of the first light emitting diode 110 and the electrode 228N of the second light emitting diode 220 to the power supply VSS. Therefore, the electrode 118N of the first light emitting diode 110 and the electrode 228N of the second light emitting diode 220 may share the transmission line 54N. In some embodiments, since the electrode 118N and the electrode 228N are integrated into the integrated electrode 240, one of the pad 52N1 and the pad 52N2 may be omitted, and the pixel circuit 60 may still generate the required driving current in the first light emitting diode 110 and the second light emitting diode 220. Similarly, the transmission line 54N may be selectively connected to only one of the pad 52N1 and the pad 52N2. Alternatively, the pad 52N1 and the pad 52N2 may be integrated into a single integrated pad without being limited to two independent pads.

In some embodiments, the pixel circuit 60 in FIG. 6 may enable the first light emitting diode 110 and the second light emitting diode 220 to emit light at the same time or not at the same time. For example, the first pixel circuit 62 and the second pixel circuit 64 may respectively receive independent signals from the data line DL1 and the data line DL2. Therefore, when the data line DL1 enables the first pixel circuit 62 such that the first light emitting diode 110 emits light, the signal on the data line DL2 may enable the second pixel circuit 64 such that the second light emitting diode 220 does not emit light, and vice versa. Alternatively, the signals on the data line DL1 and the data line DL2 may enable the first light emitting diode 110 and the second light emitting diode 220 to emit light at the same time. In this embodiment, the first light distribution curve of the first light emitting diode 110 is different from the second light distribution curve of the second light emitting diode 220. Therefore, the light emitting chip 200 may provide various light emitting effects by emitting light independently with the first light emitting diode 110, emitting light independently with the second light emitting diode 220, and emitting light simultaneously with the first light emitting diode 110 and the second light emitting diode 220. When the first light emitting diode 110 independently emits light, the light emitting effect of the light emitting chip 200 depends on the first light distribution curve. When the second light emitting diode 220 independently emits light, the light emitting effect of the light emitting chip 200 depends on the second light distribution curve. When the first light emitting diode 110 and the second light emitting diode 220 emit light simultaneously, the light emitting effect of the light emitting chip 200 is the result of combining the first light distribution curve and the second light distribution curve. In this way, the light emitting chip 200 may provide at least three light emitting modes.

FIG. 7 is a simulation diagram of the light emitting effect of the light emitting chip of an embodiment of the disclosure. In FIG. 7, the first light distribution curve DC1 and the second light distribution curve are distributed in polar coordinates. In some embodiments, the first light distribution curve DC1 is, for example, the light distribution curve of one of the light emitting diodes (e.g., the first light emitting diode 110) in the light emitting chip 100 or 200, and the second light distribution curve DC2 is, for example, the light distribution curve of another one of the light emitting diodes (e.g., the second light emitting diode 120 or 220). It may be seen from FIG. 7 that the two light emitting diodes of the light emitting chip 100 or 200 have different light distribution curves. However, the first light distribution curve DC1 and the second light distribution curve DC2 in FIG. 7 are used for illustration only. In some embodiments, the light distribution curves of the two light emitting diodes of the light emitting chip 100 or 200 show that the first light distribution curve has a first beam angle corresponding to 50% of the maximum brightness, the second light distribution curve has a second beam angle corresponding to 50% of the maximum brightness, and the first beam angle and the second beam angle fall in different angle intervals. Alternatively, the light distribution curves of the two light emitting diodes of the light emitting chip 100 or 200 show that the first light distribution curve has a maximum brightness at a first angle, and the second light distribution curve has a maximum brightness at a second angle, and the first angle is different from the second angle.

In the embodiment where the first light distribution curve DC1 and the second light distribution curve DC2 are the light distribution curves of the first light emitting diode 110 and the second light emitting diode 220 in FIG. 5, as shown in FIG. 7, the first light distribution curve DC1 has a maximum brightness at a clockwise orientation angle (i.e., taking the vertical downward line in FIG. 7 as an angle of 0 degrees, the angle measured clockwise to the left) of about 60 degrees (the first angle) and a counterclockwise orientation angle (i.e., taking the vertical downward line in FIG. 7 as an angle of 0 degrees, the angle measured counterclockwise to the right) of about 60 degrees (the first angle). The second light distribution curve DC2 has a maximum brightness at a counterclockwise orientation angle of about 65 degrees (the second angle). In addition, the first light distribution curve DC1 has a first beam angle A1 defined by 50% of the maximum brightness, and the second light distribution curve DC2 has a second beam angle A2 defined by 50% of the maximum brightness. More specifically, in this embodiment, in the angle range from the clockwise orientation angle of about 75 degrees to the counterclockwise orientation angle of about 75 degrees, the brightness of the light emitted by the first light emitting diode 110 is greater than or equal to 50% of the maximum brightness value, so the first beam angle A1 is about 150 degrees (equal to 75 degrees plus 75 degrees). For the second light emitting diode 220, in the angle range from the counterclockwise orientation angle of about 72 degrees to the counterclockwise orientation angle of about 25 degrees, the brightness of the light emitted by the second light emitting diode 220 is greater than or equal to 50% of the maximum brightness value, so the second beam angle A2 is about 47 degrees (equal to 72 degrees minus 25 degrees). Therefore, the first beam angle A1 is different from the second beam angle A2, and the first light distribution curve DC1 and the second light distribution curve DC2 may provide different light emitting effects. It should be noted that the first light distribution curve DC1 and the second light distribution curve DC2 shown in FIG. 7 are just examples, and the light distribution curves presented by the two light emitting diodes in the disclosure are not limited thereto.

In the embodiment where the first light distribution curve DC1 and the second light distribution curve DC2 are the light distribution curves of the first light emitting diode 110 and the second light emitting diode 220 in FIG. 5, since the first light emitting diode 110 and the second light emitting diode 220 of the electronic device 40 may emit light independently, the electronic device 40 may provide a light emitting effect such as the first light distribution curve DC1, a light emitting effect such as the second light distribution curve DC2, and a light emitting effect integrating the first light distribution curve DC1 and the second light distribution curve DC2. Therefore, the electronic device 40 may provide various light emitting modes to meet different application requirements.

To sum up, the electronic device according to the embodiment of the disclosure has a double crystal grain light emitting chip, and the first light emitting diode and the second light emitting diode integrated in the light emitting chip have different light distribution curves. Therefore, the light emitting effect of the electronic device is not limited by a single light emitting diode, but may be adjusted according to different requirements. In some embodiments of the electronic device, the first light emitting diode and the second light emitting diode integrated into a single light emitting chip may emit light at different times or at the same time, so that the electronic device may provide a variety of light emitting modes and has higher application flexibility.

Finally, it should be noted that the foregoing embodiments are only used to illustrate the technical solutions of the disclosure, but not to limit the disclosure; although the disclosure has been described in detail with reference to the foregoing embodiments, persons of ordinary skill in the art should understand that the technical solutions described in the foregoing embodiments may still be modified, or parts or all of the technical features thereof may be equivalently replaced; however, these modifications or substitutions do not deviate the essence of the corresponding technical solutions from the scope of the technical solutions of the embodiments of the disclosure.

What is claimed is:

1. An electronic device, comprising:
a circuit substrate; and
a light emitting chip, disposed on the circuit substrate, and the light emitting chip comprising a first light emitting diode and a second light emitting diode connected to each other,
wherein, the first light emitting diode has a first light distribution curve, the second light emitting diode has a second light distribution curve, and the first light distribution curve is different from the second light distribution curve,
wherein the first light emitting diode and the second light emitting diode are connected in series, and an N pole of the first light emitting diode is electrically connected to a P pole of the second light emitting diode.

2. The electronic device according to claim 1, wherein the first light distribution curve has a maximum brightness at a first angle, the second light distribution curve has a maximum brightness at a second angle, and the first angle is different from the second angle.

3. The electronic device according to claim 1, wherein the first light distribution curve has a first beam angle defined by 50% of a maximum brightness, the second light distribution curve has a second beam angle defined by 50% of a maximum brightness, and first beam angle is different from the second beam angle.

4. The electronic device according to claim 1, wherein the second light emitting diode comprises a second semiconductor stack and a two-dimensional photonic crystal, and the two-dimensional photonic crystal is disposed on the second semiconductor stack.

5. The electronic device according to claim 4, wherein the two-dimensional photonic crystal comprises a plurality of voids and materials with different dielectric coefficients filled in the voids.

6. The electronic device according to claim 4, wherein the second semiconductor stack comprises a first semiconductor layer, a light emitting layer and a second semiconductor layer, and the light emitting layer is disposed between the first semiconductor layer and the second semiconductor layer.

7. The electronic device according to claim 6, wherein the two-dimensional photonic crystal and the light emitting layer are located on opposite sides of the first semiconductor layer.

8. The electronic device according to claim 6, wherein the two-dimensional photonic crystal is embedded in the first semiconductor layer.

9. The electronic device according to claim 1, wherein the circuit substrate comprises a pixel circuit, and the pixel circuit is electrically connected to the first light emitting diode and the second light emitting diode connected in series.

10. An electronic device, comprising:

a circuit substrate; and a light emitting chip, disposed on the circuit substrate, and the light emitting chip comprising a first light emitting diode and a second light emitting diode connected to each other, wherein, the first light emitting diode has a first light distribution curve, the second light emitting diode has a second light distribution curve, and the first light distribution curve is different from the second light distribution curve, wherein the first light emitting diode comprises a first semiconductor stack and a one-dimensional photonic crystal, and the one-dimensional photonic crystal is disposed on the first semiconductor stack.

11. The electronic device according to claim 10, wherein the one-dimensional photonic crystal comprises a plurality of patterned Bragg reflective layers.

12. The electronic device according to claim 10, wherein the first semiconductor stack comprises a first semiconductor layer, a light emitting layer and a second semiconductor layer, and the light emitting layer is disposed between the first semiconductor layer and the second semiconductor layer.

13. The electronic device according to claim 12, wherein the one-dimensional photonic crystal and the light emitting layer are located on opposite sides of the first semiconductor layer.

14. The electronic device according to claim 12, wherein the one-dimensional photonic crystal is embedded in the first semiconductor layer.

15. The electronic device according to claim 12, wherein a portion of the first semiconductor layer exists between the one-dimensional photonic crystal and a light emitting surface of the first light emitting diode.

16. The electronic device according to claim 10, wherein an N pole of the first light emitting diode is electrically connected to an N pole of the second light emitting diode.

17. The electronic device according to claim 10, wherein a P pole of the first light emitting diode is electrically connected to a P pole of the second light emitting diode.

18. An electronic device, comprising:

a circuit substrate; and a light emitting chip, disposed on the circuit substrate, and the light emitting chip comprising a first light emitting diode and a second light emitting diode connected to each other, wherein, the first light emitting diode has a first light distribution curve, the second light emitting diode has a second light distribution curve, and the first light distribution curve is different from the second light distribution curve, wherein the circuit substrate comprises a first pixel circuit and a second pixel circuit, the first pixel circuit is electrically connected to the first light emitting diode and the second pixel circuit is electrically connected to the second light emitting diode.

19. The electronic device according to claim 18, wherein an N pole of the first light emitting diode is electrically connected to an N pole of the second light emitting diode.

20. The electronic device according to claim 18, wherein a P pole of the first light emitting diode is electrically connected to a P pole of the second light emitting diode.

* * * * *